United States Patent
Sonehara et al.

(10) Patent No.: US 10,992,127 B2
(45) Date of Patent: Apr. 27, 2021

(54) ELECTRONIC CONTROL UNIT

(71) Applicant: Hitachi Automotive Systems, Ltd., Hitachinaka (JP)

(72) Inventors: Masahito Sonehara, Hitachinaka (JP); Yoichiro Kobayashi, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 214 days.

(21) Appl. No.: 16/315,023

(22) PCT Filed: Jun. 12, 2017

(86) PCT No.: PCT/JP2017/021571
§ 371 (c)(1),
(2) Date: Jan. 3, 2019

(87) PCT Pub. No.: WO2018/016225
PCT Pub. Date: Jan. 25, 2018

(65) Prior Publication Data
US 2019/0260198 A1 Aug. 22, 2019

(30) Foreign Application Priority Data
Jul. 19, 2016 (JP) .............................. JP2016-141475

(51) Int. Cl.
*H02H 3/18* (2006.01)
*B60R 16/033* (2006.01)
(Continued)

(52) U.S. Cl.
CPC .............. *H02H 3/18* (2013.01); *B60R 16/02* (2013.01); *B60R 16/033* (2013.01);
(Continued)

(58) Field of Classification Search
CPC ........ B60R 16/033; H02H 3/087; H02H 3/18; H02H 3/28
See application file for complete search history.

(56) References Cited

U.S. PATENT DOCUMENTS

| 5,266,840 A | 11/1993 | Leipold et al. |
| 2008/0247108 A1 | 10/2008 | Ando et al. |

(Continued)

FOREIGN PATENT DOCUMENTS

| CN | 103091632 A | 5/2013 |
| CN | 103840436 A | 6/2014 |

(Continued)

OTHER PUBLICATIONS

International Search Report (PCT/ISA/210) issued in PCT Application No. PCT/JP2017/021571 dated Oct. 10, 2017 with English translation (five (5) pages).

(Continued)

*Primary Examiner* — Jared Fureman
*Assistant Examiner* — Christopher J Clark
(74) *Attorney, Agent, or Firm* — Crowell & Moring LLP

(57) ABSTRACT

There is provided an electronic control unit capable of detecting an abnormality of a dark current while suppressing increase in the size of a circuit. The electronic control unit includes a control unit that operates with a current supplied via a power-supply input terminal from a battery, and a diode arranged on a power supply path connecting the power-supply input terminal with the control unit and serving as a reverse connection protection element that prevents a reverse current when the battery is reversely connected to the power-supply input terminal, and detects an abnormality of a dark current flowing through the diode based on a
(Continued)

voltage difference between a voltage on the power-supply input terminal side of the diode and a voltage on the control unit side.

1 Claim, 5 Drawing Sheets

(51) Int. Cl.
    *B60R 16/02*     (2006.01)
    *H02H 1/00*     (2006.01)
    *G01R 19/165*     (2006.01)
    *G01R 31/50*     (2020.01)
    *G01R 31/67*     (2020.01)

(52) U.S. Cl.
    CPC .......... *G01R 19/165* (2013.01); *G01R 31/50* (2020.01); *G01R 31/67* (2020.01); *H02H 1/0007* (2013.01)

(56) References Cited

U.S. PATENT DOCUMENTS

2009/0303647 A1* 12/2009 Bauer .................... H02H 3/087
                                                      361/87
2014/0239713 A1* 8/2014 Kanzaki .................... H02J 1/00
                                                      307/11
2015/0210232 A1* 7/2015 Kanzaki .................... H02H 7/18
                                                      701/36
2016/0248262 A1   8/2016 Maruyama

FOREIGN PATENT DOCUMENTS

| | | |
|---|---|---|
| CN | 104808536 A | 7/2015 |
| CN | 105722728 A | 6/2016 |
| JP | 64-15971 U | 1/1989 |
| JP | 2-159578 A | 6/1990 |
| JP | 9-84280 A | 3/1997 |
| JP | 2011-223755 A | 11/2011 |
| JP | 2015-95086 A | 5/2015 |
| JP | 2015-100240 A | 5/2015 |

OTHER PUBLICATIONS

Japanese-language Written Opinion (PCT/ISA/237) issued in PCT Application No. PCT/JP2017/021571 dated Oct. 10, 2017 (four (4) pages).
Chinese-language Office Action issued in Chinese Application No. 201780040574.3 dated Jun. 23, 2020 (six (6) pages).

* cited by examiner

ELECTRONIC CONTROL UNIT

TECHNICAL FIELD

The present invention relates to an electronic control unit to be mounted on an automobile or the like.

BACKGROUND ART

An electronic device, such as an electronic control unit (ECU) mounted on an automobile or the like, operates using a current supplied from a battery mounted in a vehicle, but the power charged in the battery is limited to a certain degree. Thus, in addition to the power consumption during the normal operation of the electronic device, the current consumption (what is called a dark current) during a power-saving state needs to be managed and reduced.

As a technique related to such a dark current, for example, PTL 1 JP 2015-95086 A) discloses a power supply control system including a predetermined number of controllers capable of switching between an operating state in which operation performed by a plurality of electronic devices is controlled and a power-saving state in which control of the electronic devices is suspended according to a predetermined condition, a monitoring controlling means for monitoring and controlling a current supplied to each of the controllers, a first detecting means for detecting a current flowing through each of the controllers in the operating state of each of the controllers, a first current controlling means for supplying, by controlling of the monitoring controlling means, a driving current to each of the controllers in the operating state of each of the controllers, and for disconnecting the driving current to each of the controllers when a current that exceeds a predetermined threshold value is detected by the first detecting means, a second current controlling means for supplying, by controlling of the monitoring controlling means, a dark current to each of the controllers by being switched from the first current controller in the power-saving state of each of the controllers, and for disconnecting the dark current to each of the controllers in the operating state of each of the controllers, a second detecting means for detecting a voltage drop amount based on change of the dark current in the power-saving state of each of the controllers, and an abnormality determining means for determining whether there is an abnormality in the power-saving state of the controllers based on whether a predetermined voltage drop amount has been detected by the second detecting means (see claim 1 in Claims).

CITATION LIST

Patent Literature

PTL 1: JP 2015-95086 A

SUMMARY OF INVENTION

Technical Problem

However, the above conventional technique has a problem that the size of a circuit is increased because a circuit for detecting an abnormality of a dark current and a circuit for specifying an ECU in which the abnormality of the dark current has been detected (that is, other ECUs for detecting an abnormality of dark current and the like) needs to be provided outside the ECU. In addition, the above conventional technique is for detecting, as an abnormality of a dark current, that an electronic device is not in the power-saving state due to uncontrollability, and minute change of the dark current itself cannot be detected.

The present invention has been made in view of the above, and is to provide an electronic control unit capable of detecting an abnormality of a dark current while suppressing increase in the size of a circuit.

Solution to Problem

In order to achieve the above object, the present includes a load unit that operates with a current supplied via a power-supply input terminal from a battery, a reverse connection protection element that is arranged on a power supply path connecting the power-supply input terminal with the load unit and prevents a reverse current when the battery is reversely connected to the power-supply input terminal, and a current-abnormality detecting unit that detects an abnormality of a current flowing through the reverse connection protection element based on a voltage difference between a voltage on the power-supply input terminal side of the reverse connection protection element and a voltage on the load unit side.

Advantageous Effects of Invention

It is possible to detect an abnormality of a dark current while suppressing increase in the size of a circuit.

DESCRIPTION OF EMBODIMENTS

Hereinafter, embodiments of the present invention will be described with reference to the drawings.

First Embodiment

A first embodiment of the present invention will be described in detail with reference to FIGS. 1 to 3.

Figure 1:
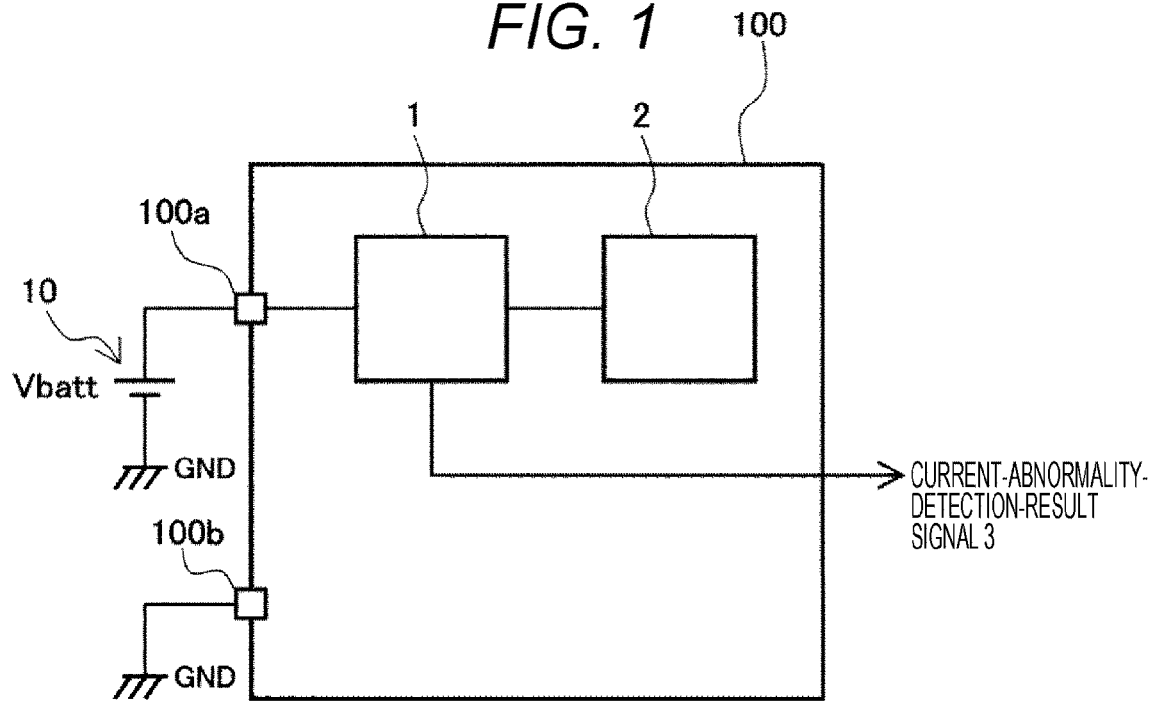
FIG. 1 is a diagram schematically showing an electronic control unit according to a first embodiment and a peripheral configuration.

FIG. 1 is a diagram schematically showing an electronic control unit according to the present embodiment and a peripheral configuration.

In FIG. 1, an electronic control unit (ECU) 100 is one of a plurality of electronic control units to be mounted on a vehicle and having various control functions, and mainly includes a control unit 2 as a load unit and a current monitor 1. The control unit 2 operates with a current supplied via a power-supply input terminal 100a from a battery 10 which is an external power supply. The current monitor 1 monitors a current flowing between the power-supply input terminal 100a and the control unit 2. The electronic control unit 100 further includes a ground terminal (GND terminal) 100b.

The control unit 2 is constituted by a control circuit (a microcomputer or the like), a power supply circuit, a driver, or the like, and performs a control function allocated to the electronic control unit 100 in a vehicle on which the electronic control unit 100 is mounted by exchanging various types of information (signals or the like) with the outside of the electronic control unit 100 (another electronic control unit, an object to be controlled, or the like) via an input/output terminal or the like (not shown).

The current monitor 1 has a reverse connection protection function for protecting the internal circuit of the electronic control unit 100 from a polarity error of the power supply connected to the power-supply input terminal 100a (that is, reverse connection of a power supply) and the like, and a current abnormality detection function for detecting an abnormality of a current (dark current) flowing from the power-supply input terminal 100a to the control unit 2 (performing current abnormality detection processing) when the control unit 2 does not operate (that is, a standby state). A result of the current abnormality detection processing of the current monitor 1 is output as a current-abnormality-detection-result signal 3 to the outside of the electronic control unit 100, and is used by other processing units (not shown) that perform various types of processing according to a state of a current detected by the current monitor 1 (that is, a normal state or an abnormal state of the current input from the power-supply input terminal 100a or of the current used in the control unit 2).

Figure 2:
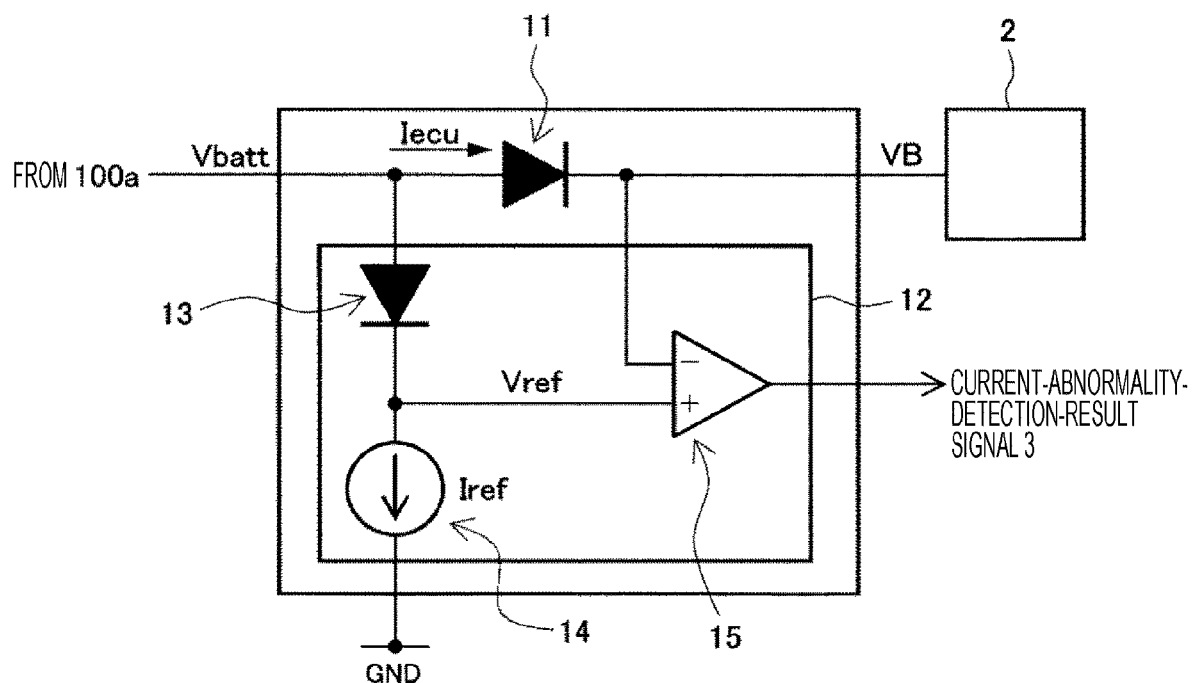
FIG. 2 is a diagram schematically showing a configuration of a current monitor and a control unit.

FIG. 2 is a diagram schematically showing a configuration of a current monitor and a control unit.

In FIG. 2, the current monitor 1 includes a diode 11 and a current-abnormality detection circuit 12. The diode 11 is arranged on a power supply path connecting the power-supply input terminal 100a with the control unit 2. The current-abnormality detection circuit 12 detects an abnormality of a current (dark current) flowing from the power-supply input terminal 100a to the control unit 2 based on the potential difference between both ends of the diode 11.

The diode 11 is arranged so that an anode side is connected to the power-supply input terminal 100a side and a cathode side is connected to the control unit 2 side, and performs the reverse connection protection function for protecting the internal circuit when reverse bias is applied, that is, when the power supply is reversely connected to the power-supply input terminal 100a or a negative surge protection function.

The current-abnormality detection circuit 12 includes a diode 13, a reference current source 14, and a comparator circuit 15. An anode side of the diode 13 is connected to the anode side of the diode 11 (the power-supply input terminal 100a side). The reference current source 14 is connected between a cathode side of the diode 13 and the GND, and adjusts a constant current (reference current Iref) so as to flow from the diode 13 to the GND. The comparator circuit 15 receives a voltage (voltage VB) on the cathode side of the diode 11 (the control unit 2 side) and a voltage (reference voltage Vref) on the cathode side of the diode 13, and outputs the comparison result.

When the control unit 2 does not operate (is in the standby state), the comparator circuit 15 outputs a Low signal (for example, GND voltage) as a detection result (a current-abnormality-detection-result signal 3) indicating that the current (dark current) flowing through the diode 11 is a normal value when the voltage VB on the cathode side of the diode 11 is higher than the reference voltage Vref. Alternatively, when the control unit 2 does not operate (is in the standby state), the comparator circuit 15 outputs a High signal (for example, the power supply voltage of the electronic control unit 100) as a detection result (a current-abnormality-detection-result signal 3) indicating that the current (dark current) flowing through the diode 11 is an abnormal value when the voltage VB on the cathode side of the diode 11 is lower than the reference voltage Vref.

In other words, it can be said that the comparator circuit 15 compares the voltage drop due to the current flowing through the diode 11 with the voltage drop due to the current flowing through the diode 13. Thus, for example, when the same type diode is used for the diode 11 and the diode 13, it is possible to determine whether the dark current is abnormal based on whether the dark current flowing through the diode 11 is larger or smaller than the reference current Iref, that is, it is possible to simply use the reference current Iref as a reference value of the dark current. Note that, by using the same type and same lot IC (element) is used for the diode 11 and the diode 13 or forming the diode 11 and the diode 13 in the vicinity of the same semiconductor element, it is possible to suppress the influence of the temperature characteristic and the characteristic variation, and to stably detect an abnormality of the dark current.

The current-abnormality detection circuit 12 may intermittently detect an abnormality of the dark current (perform the current abnormality detection processing), and it is possible to suppress the current consumption by stopping the operation of the reference current source 14 and the comparator circuit 15 when the current abnormality detection processing is not performed.

Figure 3:
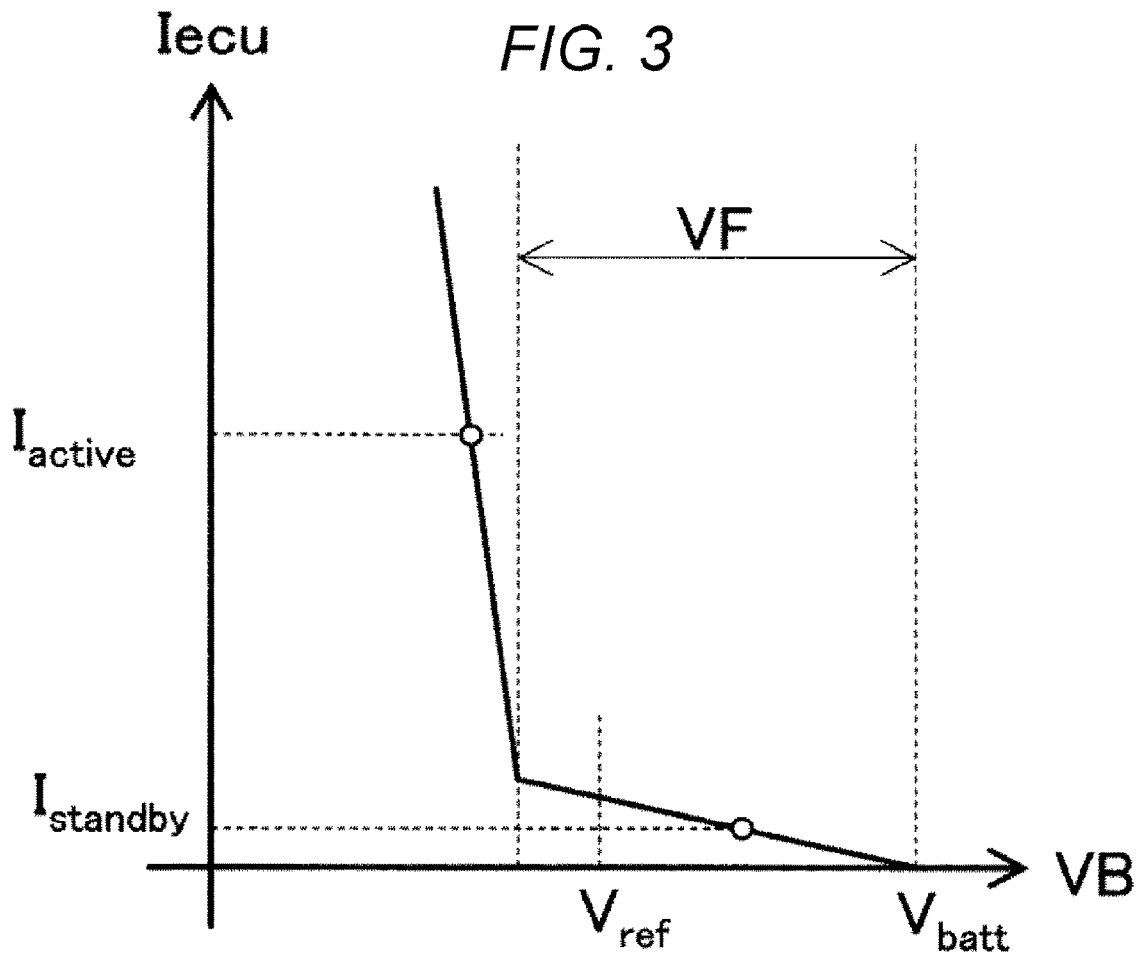
FIG. 3 is a diagram schematically showing an example of the relationship between a voltage between both ends of a diode arranged on a power supply path connecting a power-supply input terminal and a control unit and a current flowing therebetween.

FIG. 3 is a diagram schematically showing an example of the relationship between a voltage (potential difference) between both ends of a diode arranged on the power supply path connecting a power-supply input terminal with a control unit and a current flowing therebetween, in which the current is shown as the vertical axis and the voltage is shown as the horizontal axis.

In FIG. 3, it is assumed that the current flowing through the diode 11 is Iecu, the voltage on the cathode side of the diode 11 is VB, and the voltage of the battery is Vbatt. When the control unit 2 does not consume power, the current Iecu flowing through the diode 11 and the voltage drop become zero, and which means that the voltage VB equals Vbatt. As the power consumption in the control unit 2 increases, the current Iecu flowing through the diode 11 and the voltage drop increase. Then, when the difference between the voltage Vbatt and the voltage VB (that is, the voltage between both ends of the diode 11) exceeds the forward voltage VF, the current Iecu abruptly increases. In FIG. 3, the current when the control unit 2 operates (that is, an active state) is indicated as Iactive and the current when the control unit 2 does not operate (a standby state) is indicated as Istandby, as an example. In the range of VF>Vbatt−VB, since the sensitivity of the voltage change is large with respect to a minute change in the current Iecu which is a minute current, the reference voltage Vref is set within the range of VF>Vbatt−Vref to highly accurately detect the dark current flowing through the diode 11.

Note that, in order to detect an abnormal current when the control unit 2 operates (is in the active state), the reference voltage Vref is changed so as to be Vref Bbatt−VB by controlling/changing the reference current Iref.

The effects of the present embodiment configured as described above are described.

The conventional technique has a problem that the size of a circuit is increased because a circuit for detecting an abnormality of a dark current and a circuit for specifying an ECU in which the abnormality of the dark current has been detected (that is, other ECUs for detecting an abnormality of dark current and the like) needs to be provided outside the ECU. In addition, the conventional technique is for detecting, as an abnormality of a dark current, that an electronic device is not in the power-saving state due to uncontrollability, and minute change of the dark current itself cannot be detected.

In contrast, the present embodiment has a configuration including the control unit 2 serving as a load unit that operates with the current Iecu supplied via the power-supply input terminal 100a from the battery 10, the diode 11 arranged on the power supply path connecting the power-supply input terminal 100a with the control unit and serving as a reverse current protection element that prevents a reverse current when the battery 10 is reversely connected to the power-supply input terminal 100a, and the current-abnormality detection circuit 12 that detects an abnormality of the current flowing through the diode 11 based on the voltage difference between the voltage Vbatt on the power-supply input terminal 100a side of the diode 11 and the voltage VB on the control unit 2 side.

Since the reverse connection protection element performs an important function provided to the power-supply input terminal of the electronic control unit, it is often mounted on the electronic control unit. However, it is possible to detect an abnormality of a dark current while suppressing increase in circuits in the present embodiment for detecting an abnormality of the dark current using the voltage between both ends of the reverse connection protection element.

Furthermore, there is no need to separately prepare an ECU or the like for detecting an abnormality of a dark current, and it is possible to further contribute to suppression of increase in circuits.

In addition, a diode is used as the reverse connection protection element provided in each electronic control unit, and it is possible to highly accurately detect an abnormality of a dark current for each ECU.

Second Embodiment

A second embodiment of the present invention will be described in detail with reference to FIGS. 4 to 6.

In the present embodiment, a metal-oxide-semiconductor field-effect transistor (MOSFET) is used instead of the diode shown as the reverse connection protection element in the current monitor in the first embodiment.

Figure 4:
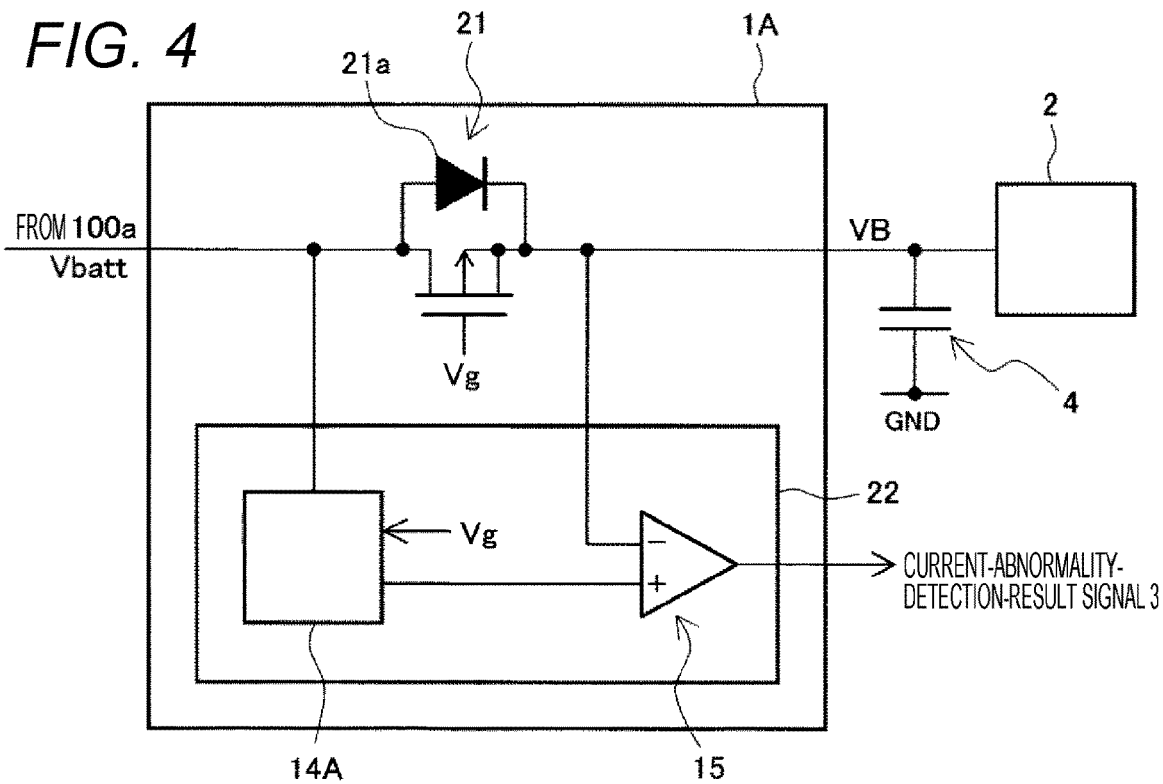
FIG. 4 is a diagram schematically showing a configuration of a current monitor according to a second embodiment and a control unit.

FIG. 4 is a diagram schematically showing a configuration of a current monitor according to the present embodiment and a control unit. In the drawing, the same reference signs are assigned to the same members as those in the first embodiment, and the explanation thereof is omitted.

In FIG. 4, a current monitor 1A has a reverse connection protection function for protecting the internal circuit of an electronic control unit 100 from a polarity error of the power supply connected to a power-supply input terminal 100a (that is, reverse connection of a power supply) and the like, and a current abnormality detection function for detecting an abnormality of a current (operating current/dark current) flowing from the power-supply input terminal 100a to a control unit 2 when the control unit 2 operates (that is, an active state) and does not operate (that is, a standby state), and outputs a result of current abnormality detection processing to the outside of the electronic control unit 100 as a current-abnormality-detection-result signal 3.

The current monitor 1A includes a MOSFET 21 arranged on a power supply path connecting the power-supply input terminal 100a with the control unit 2, and a current-abnormality detection circuit 22 that detects an abnormality of a current flowing from the power-supply input terminal 100a to the control unit 2 based on the potential difference between both ends of the MOSFET 21.

The MOSFET 21 is arranged so that an anode side of a body diode 21a (also referred to as a parasitic diode or a built-in diode) formed therein is connected to the power-supply input terminal 100a side and a cathode side is connected to the control unit 2 side. The body diode 21a performs a reverse connection protection function for protecting the internal circuit when reverse bias is applied, that is, when the power supply is reversely connected to the power-supply input terminal 100a, or a negative surge protection function. The MOSFET 21 is switched between a shut-down state (a state in which no current flows) and a conductive state (a state in which a current flows) by a control signal (gate signal) Vg input to the gate from another processing unit (for example, a processing unit provided outside the control unit 2 or the electronic control unit 100). When the control unit 2 is in the active state, an ON signal for switching the MOSFET to the conductive state is input to the gate of the MOSFET 21 as the control signal Vg. When the control unit 2 is in the standby state, an OFF signal for switching the MOSFET 21 to the shut-down state is input to the gate of the MOSFET 21 as the control signal Vg.

The current-abnormality detection circuit 22 includes a reference-voltage setting unit 14A and a comparator circuit 15. The reference-voltage setting unit 14A sets the reference voltage Vref based on the voltage on the power-supply input terminal 100a side of the MOSFET 21 (in other words, the anode side of the body diode 21a). The comparator circuit 15 receives the voltage (voltage VB) on the control unit 2 side of the MOSFET 21 (in other words, the cathode side of the body diode 21a) and the reference voltage Vref, and outputs the comparison result.

When the voltage VB on the control unit side of the MOSFET 21 is higher than the reference voltage Vref, the comparator circuit 15 outputs a Low signal (for example, GND voltage) as a detection result (a current-abnormality-detection-result signal 3) indicating that the current (operating current/dark current) flowing through the MOSFET 21 and the body diode 21a is a normal value. Alternatively, when the voltage VB on the power-supply input terminal 100a side of the MOSFET 21 is lower than the reference voltage Vref, the comparator circuit 15 outputs a High signal (for example, the power supply voltage of the electronic control unit 100) as a detection result (a current-abnormality-detection-result signal 3) indicating that the current (operating current/dark current) flowing through the MOSFET 21 (including the body diode 21a) is an abnormal value.

The reference-voltage setting unit 14A acquires the control signal Vg of the MOSFET 21. When an ON signal for controlling the MOSFET 21 to be in the conductive state is input, the reference-voltage setting unit 14A outputs the reference voltage Vref during the control unit 2 is in the active state (particularly referred to as a reference voltage Vrefon) to the comparator circuit 15. When an OFF signal for controlling the MOSFET 21 to be in the shut-down state is input, the reference-voltage setting unit 14A outputs the reference voltage during the control unit 2 is in the standby state (particularly referred to as a reference voltage Vrefoff) to the comparator circuit 15.

Figure 5:
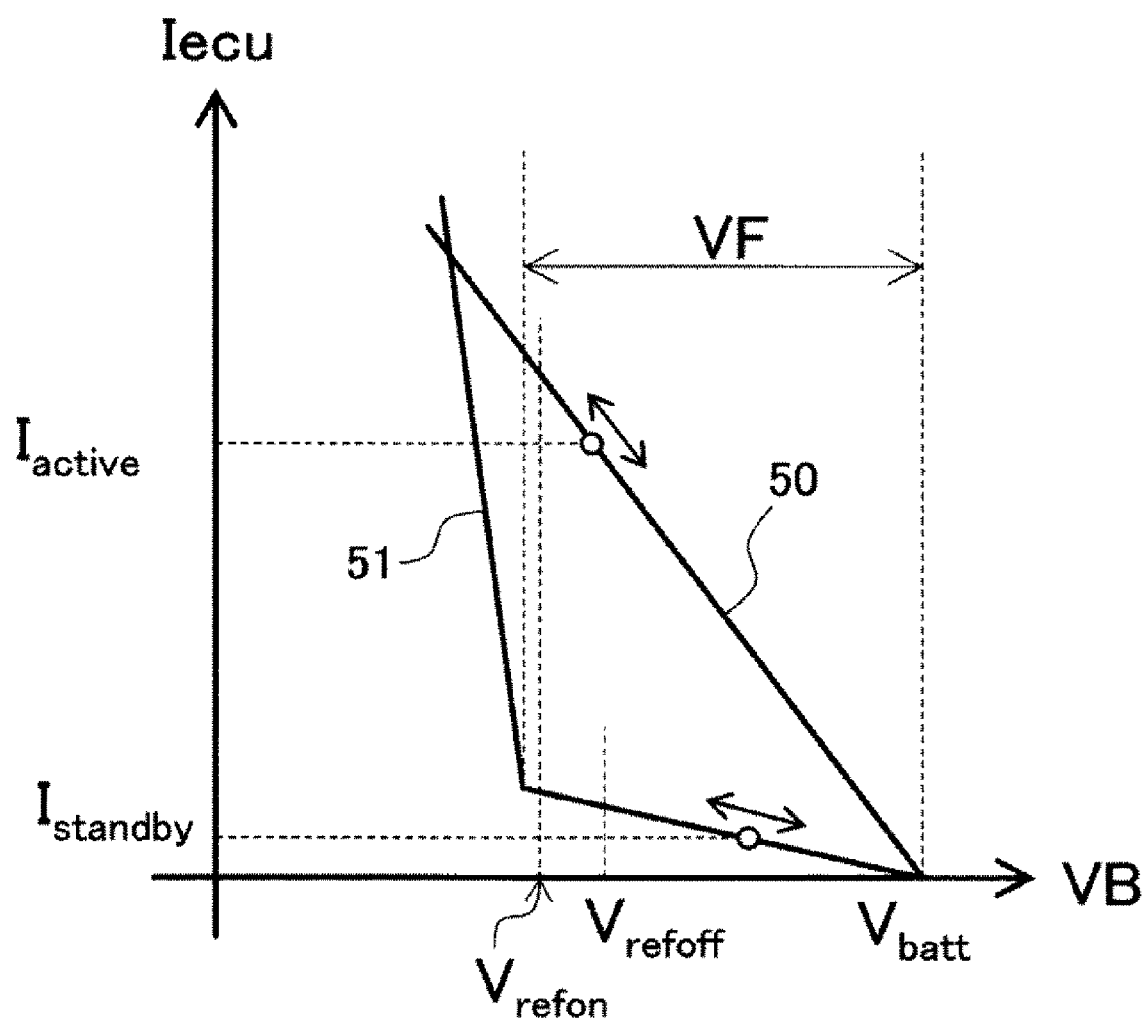
FIG. 5 is a diagram schematically showing an example of the relationship between a voltage between both ends of a MOSFET and a current flowing therebetween.

FIG. 5 is a diagram schematically showing an example of the relationship between a voltage (potential difference) between both ends of the MOSFET and a current flowing therebetween, in which the current is shown as the vertical axis and the voltage is shown as the horizontal axis.

In FIG. 5, it is assumed that the current flowing through the MOSFET 21 (including the body diode 21a) is Iecu, the voltage on the control unit 2 side of the MOSFET (the cathode side of the body diode 21a) is VB, and the voltage of the battery 10 to be input to the power-supply input terminal 100a side of the MOSFET 21 (the anode side of the body diode 21a) is Vbatt.

When the control unit 2 is in the active state and the control signal Vg of the MOSFET 21 is the ON signal, the MOSFET 21 is in the conductive state (low resistance state), and the body diode 21a is in a state of operating in the OFF region. Thus, as indicated by a solid line 50 in FIG. 5, when the control unit 2 does not consume power, the current Iecu flowing through the MOSFET 21 and the voltage drop become zero, and which means that the voltage VB equals Vbatt. As the power consumption in the control unit 2 increases, the current Iecu flowing through the MOSFET 21 and the voltage drop increase. FIG. 5 exemplifies the current during the control unit 2 is in the active state as Iactive.

By setting the reference voltage Vref (Vrefon) when the control unit 2 is in the active state and the control signal Vg of the MOSFET 21 is the ON signal, the operating current flowing through the MOSFET 21 can be detected. Note that, the case in which the body diode 21a is in the ON state due to the voltage drop by the MOSFET 21 is not considered, and it is assumed that the reference voltage Vrefon is set in the range of VF>Vbatt−Vrefon (the range in which the body diode 21a is not turned ON).

In addition, when the control unit 2 is in the standby state and the control signal Vg of the MOSFET 21 is the OFF signal, the MOSFET 21 is in the shut-down state (high resistance state), and the body diode 21a mainly operates. That is, as indicated by a solid line 51 in FIG. 5, when the control unit 2 does not consume power, the current Iecu flowing through the body diode 21a and the voltage drop become zero, and which means that the voltage VB equals Vbatt. As the power consumption in the control unit 2 increases, the current Iecu flowing through the body diode 21a and the voltage drop increase. Then, when the difference between the voltage Vbatt and the voltage VB (that is, the voltage between both ends of the body diode 21a) exceeds the forward voltage VF, the current Iecu abruptly increases. FIG. 5 exemplifies the current during the control unit 2 is in the standby state as Istandby.

Then, in the range of VF>Vbatt−VB, that is, in the range in which the sensitivity of the voltage change is large with respect to a minute change in the current Iecu which is a minute current, the reference voltage Vref (Vrefoff) is set within the range of VF>Vbatt−Vrefoff to highly accurately detect the dark current flowing through the body diode 21a.

Other configurations are the same as those in the first embodiment.

In the present embodiment configured as described above, the same effects as those in the first embodiment can be obtained.

In addition, the following effects can be further obtained in the present embodiment.

Figure 6:
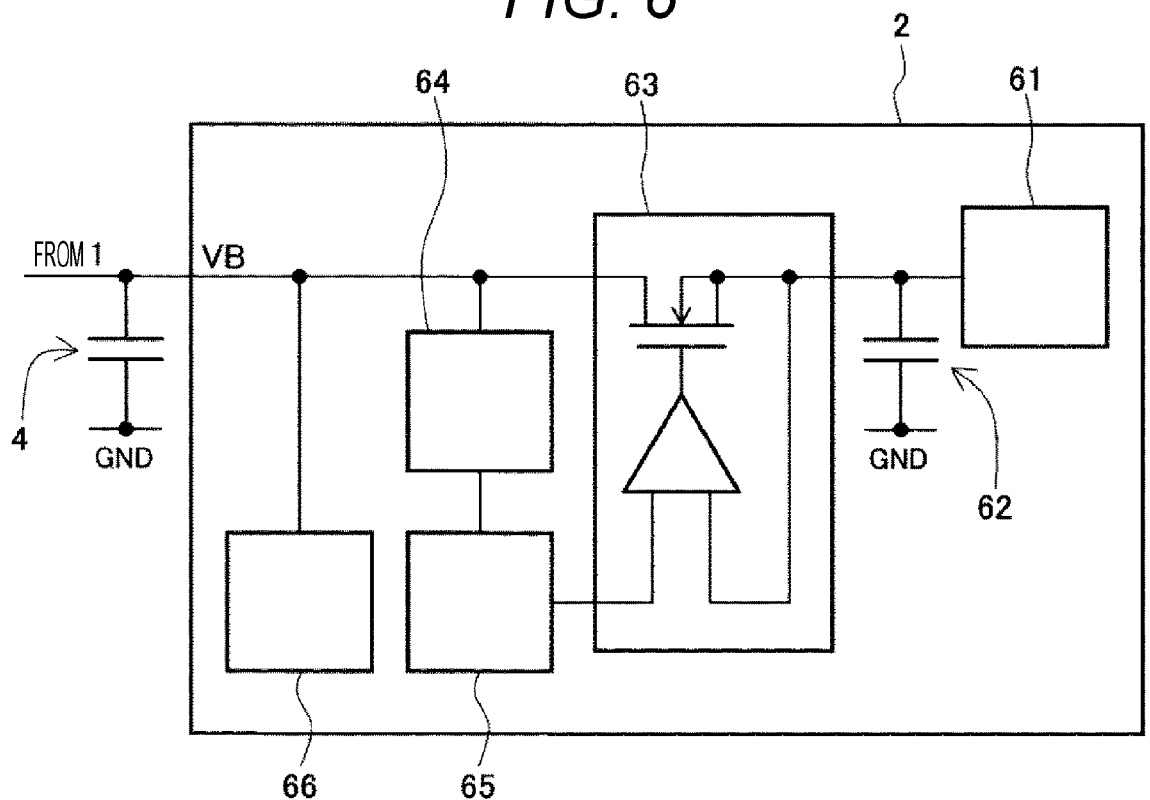
FIG. 6 is a diagram schematically showing an example of a configuration of a control unit 2 in the second embodiment.

FIG. 6 is a diagram schematically showing an example of a configuration of the control unit 2 in the present embodiment.

In FIG. 6, the control unit 2 mainly includes a microcomputer 61 as a control circuit, a voltage monitor 66, an internal power supply 64, an overcurrent detector 63, a reference-voltage generator 65, and a decoupling capacitor 62. The voltage monitor 66 monitors the voltage VB input to the control unit 2 via the current monitor 1. The internal power supply 64 serves as a power supply circuit that operates using the power input to the control unit 2 via the current monitor 1. The overcurrent detector 63 detects and prevents an overcurrent of the current input to the microcomputer 61 of the control unit 2 via the current monitor 1. The reference-voltage generator 65 generates, from the voltage of the internal power supply 64, a reference voltage to be used in the overcurrent detector 63. The decoupling capacitor 62 suppresses the fluctuation of the voltage to be input to the microcomputer 61. Between the current monitor 1 and the control unit 2, a decoupling capacitor 4 that suppresses the fluctuation of the voltage to be input from the current monitor 1 to the control unit 2 is arranged.

That is, in the present embodiment, it is possible for the current monitor 1 to prevent an overcurrent in addition to the overcurrent detector 63 that prevents an overcurrent caused by a failure of the microcomputer 61 of the control unit 2 or a short circuit of the decoupling capacitor 62. Thus, it is possible to duplicate the overcurrent detection function, and to improve the reliability of the overcurrent detection function. Furthermore, it is possible to provide the overcurrent detection function to, for example, a control unit having no overcurrent detection function, and to improve the reliability.

In addition, in the exemplified control unit 2, since the decoupling capacitor 4 arranged at the input part of the power supply of the control unit 2 is arranged on the upstream side of the overcurrent detector 63, the overcurrent detector 63 cannot detect a short circuit of the decoupling capacitor 4. However, the current monitor 1 can detect a short circuit of the decoupling capacitor 4 when the control unit 2 is in the active state, monitor minor leak (dark current) of the voltage monitor 66, the internal power supply 64, the reference-voltage generator 65, and the like of the control unit 2 during the control unit 2 is in the standby state, and detect an abnormality, and it is possible to improve the reliability.

Third Embodiment

A third embodiment of the present invention will be described in detail with reference to FIGS. 7 and 8.

In the present embodiment, a diagnostic function of a MOSFET is provided in the second embodiment.

Figure 7:
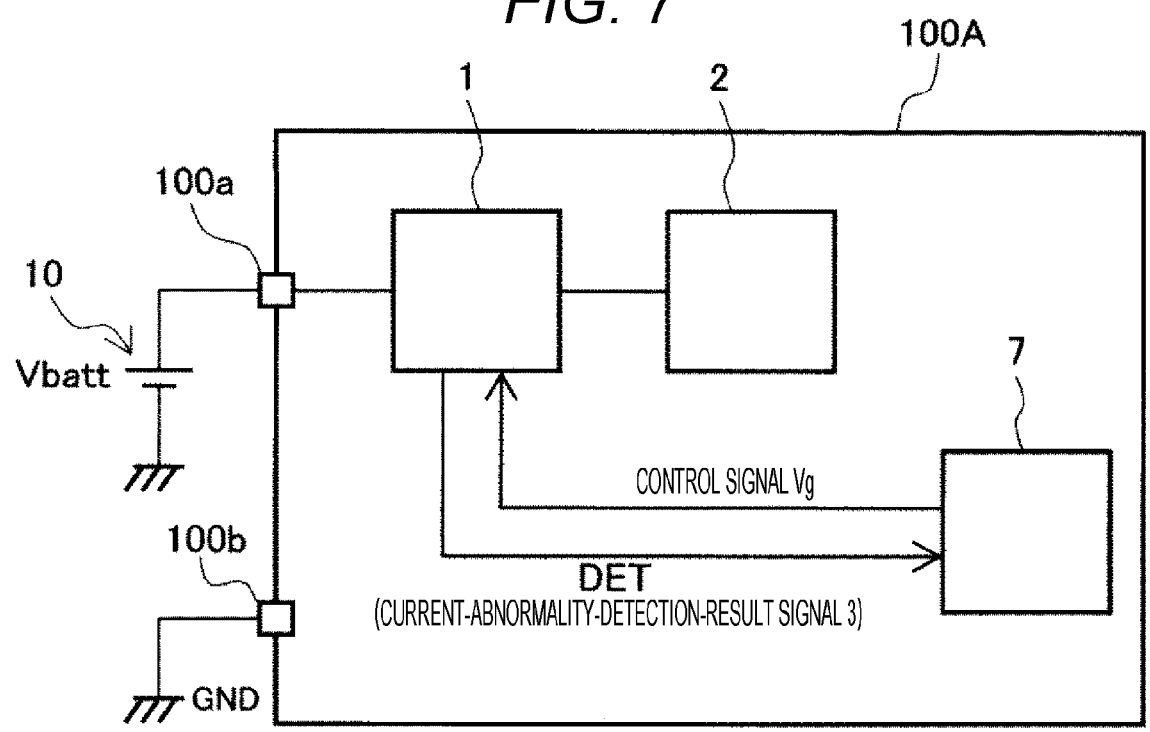
FIG. 7 is a diagram schematically showing an electronic control unit according to a third embodiment and a peripheral configuration.

FIG. 7 is a diagram schematically showing an electronic control unit according to the present embodiment and a peripheral configuration. In the drawing, the same reference signs are assigned to the same members as those in the first and second embodiments, and the explanation thereof is omitted.

In FIG. 7, an electronic control unit 100A is one of a plurality of electronic control units to be mounted on a vehicle and having various control functions, and mainly includes a control unit 2 as a load unit, and a current monitor 1, and a diagnostic device 7. The control unit 2 operates with a current supplied via a power-supply input terminal 100a from a battery 10 which is an external power supply. The current monitor 1 monitors a current flowing between the power-supply input terminal 100*a* and the control unit 2. The diagnostic device 7 performs diagnostic processing to the MOSFET 21 of the current monitor 1. The electronic control unit 100A further includes a ground terminal (GND terminal) 100*b*.

The diagnostic device 7 outputs a control signal Vg of the MOSFET 21 of the current monitor 1 based on a control signal (not shown) from the outside of the electronic control unit 100A to perform the ON/OFF control, and performs diagnosis processing for diagnosing whether the MOSFET 21 is normal.

Figure 8:
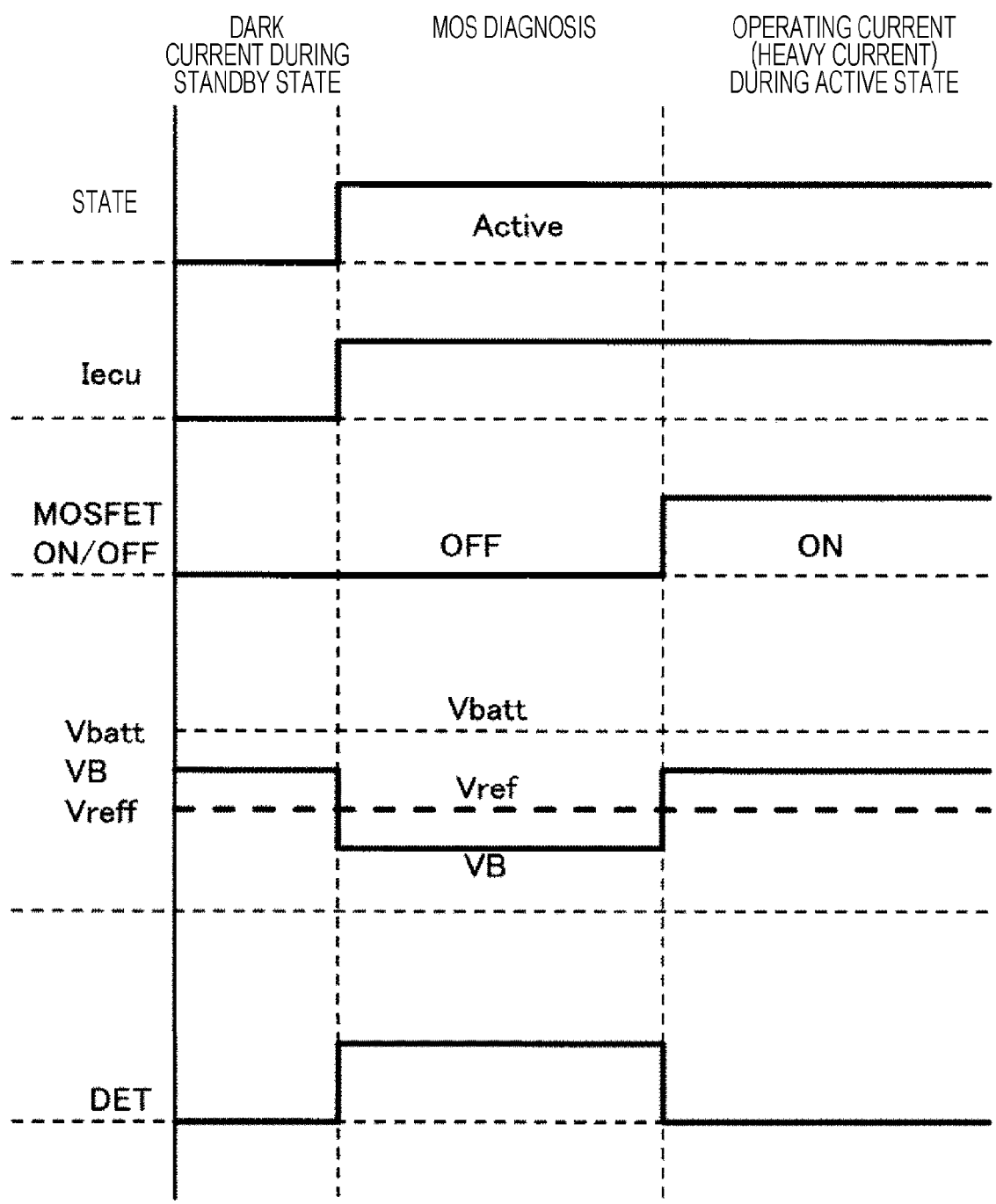
FIG. 8 is a diagram showing changes in signals and voltages during diagnostic processing of a diagnostic device.

FIG. 8 is a diagram showing changes in signals and voltages during diagnostic processing of the diagnostic device, in which the state of voltage or the like is shown as the vertical axis and the time is shown as the horizontal axis. FIG. 8 exemplifies that the MOSFET 21 normally operates.

In FIG. 8, when the control unit 2 is in the standby state, the current Iecu is minute. The diagnostic device 7 controls the control signal Vg of the MOSFET 21 so that the MOSFET 21 is in the OFF state. At this time, a DET signal (current-abnormality-detection-result signal 3) becomes the Low signal (normal).

Next, as the diagnostic processing, when the control unit 2 is changed from the standby state to the active state, the current Iecu becomes the operating current. This current is supplied by turning ON the body diode 21*a*. The diagnostic device 7 further controls the control signal Vg of the MOSFET 21 so that the MOSFET 21 remains in the OFF state. At this time, the DET signal (current-abnormality-detection-result signal 3) becomes the High signal. However, the DET signal at this time (during the diagnosis processing) is not handled when the current (dark current) flowing through the MOSFET 21 (or the body diode 21*a*) is an abnormal value.

Then, the diagnostic device 7 controls the control signal Vg of the MOSFET 21 so that the MOSFET 21 is in the ON state. At this time, the DET signal (current-abnormality-detection-result signal 3) becomes the Low signal.

In this manner, in the diagnosis processing, the DET signal (current-abnormality-detection-result signal 3) becomes High by controlling the MOSFET 21 so as to be in the OFF state when the control unit 2 is in the active state, and thus it is possible to diagnosis that the MOSFET 21 is in the OFF state properly.

The time for the diagnosis processing (the time during which the body diode 21*a* is in the ON state) is set to be sufficiently short in consideration of the characteristics of the body diode of the MOSFET. Since a large size MOSFET is used for the current monitor applied to the power supply of the electronic control unit or the like, the body diode thereof is also sufficiently large, and it is possible to secure a sufficient time for performing the diagnosis processing within the time during which the body diode normally operates although the body diode is in the ON state.

In the present embodiment, it has been exemplified that the diagnosis processing is performed when the control unit 2 shifts from the standby state to the active state. However, the diagnosis processing may be performed when the control unit 2 shifts from the active state to the standby state, or is in the active state, the standby state, or the like.

Other configurations are the same as those in the first and second embodiments.

In the present embodiment configured as described above, the same effects as those in the first and second embodiments can be obtained.

Furthermore, it is possible to diagnose whether the MOSFET operates normally, and to further improve the reliability.

Other Embodiments

The present invention is not limited to the above embodiments, and includes various modified examples.

For example, in each embodiment, the electronic control unit may be provided with a notification control unit that controls notification to a driver, and output, when an abnormality of a dark current is detected by the current monitor (when the current-abnormality-detection-result signal 3 is High), a signal indicating that an abnormality of a dark current has occurred to a notifying means (monitor or speaker) arranged outside the electronic control unit or a control unit thereof so as to notify the driver of the abnormality.

Furthermore, when an abnormality of a dark current is detected, the current abnormality detection processing may be performed when the control unit 2 is in the active state after the MOSFET is switched to the ON state to estimate a failure mode by comparing the detection result in the ON state with the detection result in the OFF state, and the notification may be performed to the host system or the driver. At this time, the reference voltage in the current abnormality detection processing may be switched in each of the active state and the standby state to estimate the detailed failure mode. Furthermore, the notification content may be changed according to the charging state of the battery. For example, if the charging state of the battery is lower than a predetermined reference value when an abnormality of a dark current has been detected, a predetermined function may be stopped, or if the charging state of the battery is higher than a predetermined reference value, the processing may be switched so as to inform the driver of the abnormality.

In addition, it is not necessary to instantly inform the driver of the abnormality when the abnormality of the dark current has been detected, and the notification may be performed at the next time the vehicle is started. Until the notification, the current consumption may be reduced by stopping low-priority functions.

The above embodiments have been described in detail in order for the present invention to be easily understood, and are not necessarily limited to those having all the described configurations. Moreover, a part or all of the above configurations, functions, and the like may be implemented by being designed, for example, in an integrated circuit. Alternatively, a part or all of the above configurations, functions, and the like may be implemented by software by interpreting and executing programs for implementing each function by a processor.

REFERENCE SIGNS LIST

1, 1A current monitor
2 control unit
3 current-abnormality-detection-result signal
4, 62 decoupling capacitor
7 diagnostic device
10 battery
11 diode
12 current-abnormality detection circuit
13 diode
14 reference current source
14A reference-voltage setting unit 15 comparator circuit
21 MOSFET
21a body diode
22 current-abnormality detection circuit
61 microcomputer
63 overcurrent detector
64 internal power supply
65 reference-voltage generator
66 voltage monitor
100, 100A electronic control unit (ECU)
100a power-supply input terminal
100b ground (GND) terminal

The invention claimed is:

1. An electronic control unit comprising:
a load unit configured to operate with a current supplied via a power-supply input terminal from a battery;
a reverse connection protection element arranged on a power supply path connecting the power-supply input terminal with the load unit and configured to prevent a reverse current when the battery is reversely connected to the power-supply input terminal; and
a current-abnormality detecting unit configured to detect an abnormality of a current flowing through the reverse connection protection element based on a voltage difference between a voltage on the power-supply input terminal side of the reverse connection protection element and a voltage on the load unit side, wherein
the reverse connection protection element is constituted by a first diode having an anode side connected to the power-supply input terminal side and a cathode side connected to the load side, and
the current-abnormality detecting until includes a second diode having an anode side connected to the power-supply input terminal side of the reverse connection protection element, and detects an abnormality of a current flowing through the reverse connection protection element based on a voltage difference between a voltage on a cathode side of the second diode through which a predetermined constant current flows and a voltage on the load unit side of the first diode.

* * * * *